United States Patent
Dewa et al.

(10) Patent No.: US 6,709,948 B2
(45) Date of Patent: Mar. 23, 2004

(54) PROCESS FOR MANUFACTURING A TWO-AXIS MIRROR

(75) Inventors: Andrew S. Dewa, Plano, TX (US); John W. Orcutt, Richardson, TX (US); David Ian Forehand, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/146,169

(22) Filed: May 15, 2002

(65) Prior Publication Data

US 2003/0119275 A1 Jun. 26, 2003

Related U.S. Application Data

(60) Provisional application No. 60/342,248, filed on Dec. 21, 2001.

(51) Int. Cl.[7] .............................................. H01L 21/76
(52) U.S. Cl. ........................................ 438/401; 438/406
(58) Field of Search ........................................... 438/401

(56) References Cited

U.S. PATENT DOCUMENTS

| | | | | |
|---|---|---|---|---|
| 6,159,385 A | * | 12/2000 | Yao et al. | 216/2 |
| 6,337,027 B1 | * | 1/2002 | Humphrey | 216/2 |
| 6,344,417 B1 | * | 2/2002 | Usenko | 438/733 |
| 6,425,971 B1 | * | 7/2002 | Silverbrook | 156/230 |

* cited by examiner

*Primary Examiner*—David Nelms
*Assistant Examiner*—Thao Phuong Le
(74) *Attorney, Agent, or Firm*—William B. Kempler; W. James Brady, III; Frederick J. Telecky, Jr.

(57) ABSTRACT

A process for manufacturing a wafer from a layer of material such as silicon and having a multiplicity of MEMS devices such as mirrors with gimbals formed thereon is disclosed. The features of the devices on the wafer as well as the boundaries which separate individual devices are defined by lines having a constant width so as to avoid microloading effects. Waste areas of the layer of material which are greater than the constant line width are removed as breakout pieces during the release process.

33 Claims, 4 Drawing Sheets

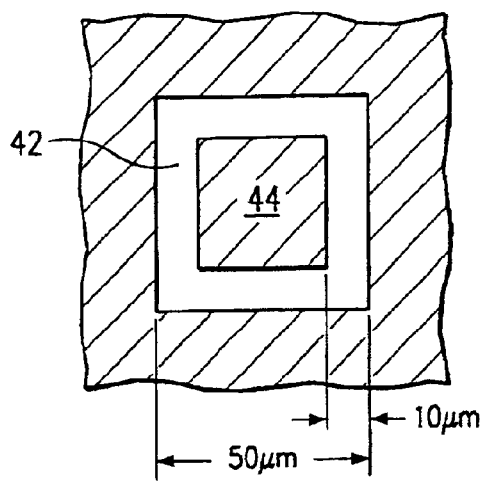 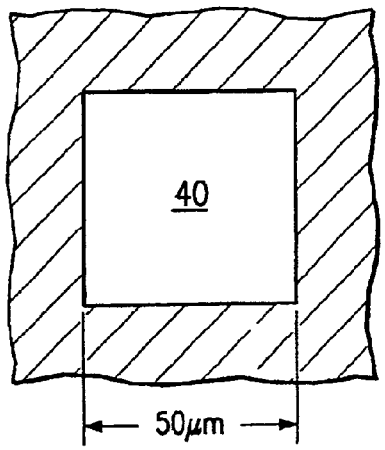
FIG. 3A    FIG. 3B
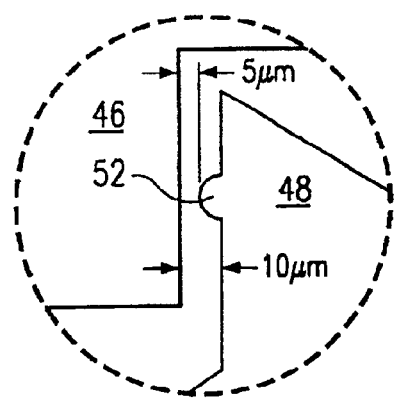
FIG. 4A
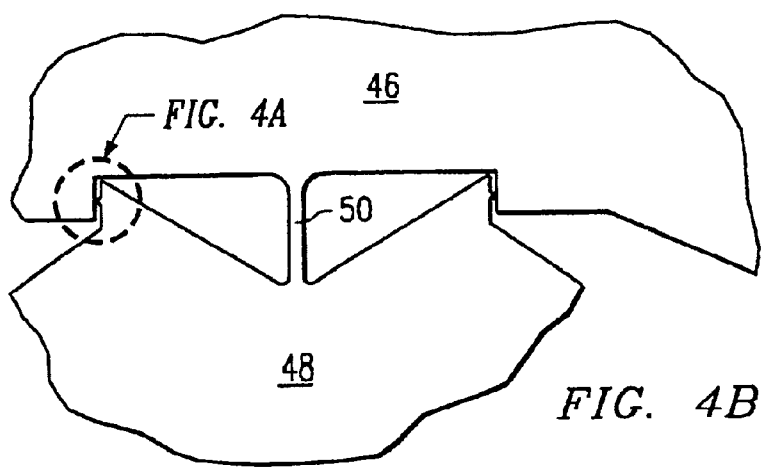
FIG. 4B

PROCESS FOR MANUFACTURING A TWO-AXIS MIRROR

This application claims the benefit of U.S. Provisional Patent Application No. 60/342,248, filed Dec. 21, 2001, which is incorporated herein by reference.

FIELD OF THE INVENTION

This unit relates generally to apparatus and methods for manufacturing MEMS (micro-electromechanical systems) by forming a multiplicity of such devices on a silicon wafer. More specifically, the invention relates to a process for manufacturing a multiplicity of very flat (e.g. having a radius of curvature greater than 40 meters) two-axis silicon elliptical mirrors used for optical switching and other light beam steering applications by minimizing the microloading effect during plasma etching.

BACKGROUND OF THE INVENTION

MEMS devices are becoming more and more available and common. However, these devices are extremely small compared to regular machines, but still very large when compared to the individual circuits or components and features found on IC's and other electronic chips. Some MEMS devices such as the digital micromirror device arrays produced by Texas Instruments are made significantly smaller than most other types of MEMS devices, but are also very large compared to components on an IC or other chips and use existing geometry and patterning techniques common for the productions of semiconductor circuits. For example, small analog MEMS devices used for optical switching of transmitted data streams may have a size in the millimeter range, whereas the mirrors on micromirror arrays used for display devices are typically between about 15–20 microns on a side. Thus, it is seen that MEMS devices are not comfortably compared with either full-size machines or devices (they are much smaller) or a true array of micro devices such as IC's, memory chips, and the like (they are much larger).

Known processes for fabricating MEMS type mirrors include micro-machining polysilicon, using SOI (silicon on insulator) wafers. Mirrors produced by this process however, are typically very thin and consequently maintaining the desired flatness is very difficult.

SUMMARY OF THE INVENTION

The present invention provides a process for manufacturing a plurality of MEMS devices on a first layer of material, such as for example, a thin wafer of silicon typically having a thickness of about 115 $\mu$m. The process comprises attaching the thin silicon wafer to a carrier or backing wafer and then defining boundaries and features for each individual device of said plurality of devices with a constant line width.

After defining or placing the lines which define the features of the individual devices and the boundary or separation lines between individual devices, the wafer while attached to the backing wafer is etched such that both the separation lines and lines defining features on the device are etched through the selected thickness. The use of a constant line width helps eliminate over-etching or under-etching due to the phenomenon called microloading. Microloading is the differential etch rate between wide lines and narrow lines (wide lines etch faster) in a plasma reactor.

The devices are then separated from the backing layer. It should also be noted that the wafer used to manufacture the mirrors or the devices could be silicon or another suitable material. Further, the wafer may also undergo other processing steps before and after the etching process. For example, electronics, sensors or other mechanical features can be created by standard IC or MEMS fabrication processes before the etching step, and a reflective coating such as gold may be applied before the devices are separated from the backing layer.

BRIEF DESCRIPTION OF THE DRAWINGS

The above-mentioned features as well as other features of the present invention will be more clearly understood from consideration of the following description in connection with the accompanying drawings in which:

FIGS. 3A and 3B illustrate a method of removing wafer waste areas greater than about 50 $\mu$m; and FIGS. 4A and 4B illustrate how device features having a separation less than a narrow line width may be formed by a first method.

DESCRIPTION OF PREFERRED EMBODIMENTS

The present invention discloses a process for manufacturing a two-axis analog micromirror MEMS device fabricated out of a single piece of material (such as silicon, for example) typically having a thickness of about 115 $\mu$m. The die layout consists of an oval mirror, normally 3.8 mm×3.2 mm supported on a gimbal frame by two silicon torsional hinges. The gimbal frame is attached to the die frame by another orthogonal set of torsional hinges. According to a preferred embodiment, the mirror die (i.e. each individual device) is fabricated by using a deep resistive ion etch (DRIE) of the 115 $\mu$m thick silicon wafer in a specialized ICP (Inductively Coupled Plasma) reactor.

Figure 1A:
FIGS. 1A through 1H illustrate the various steps of the manufacturing process of this invention.
Figure 1B:
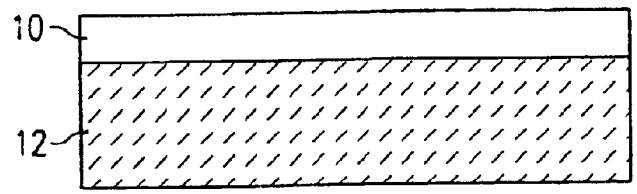
Figure 1C:
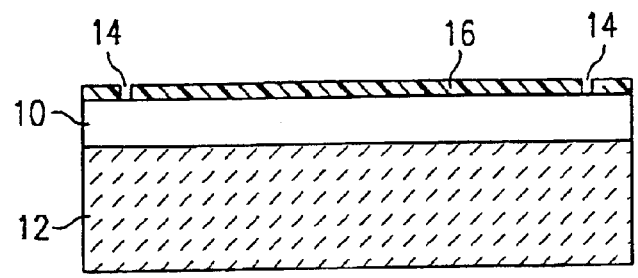
Figure 1D:
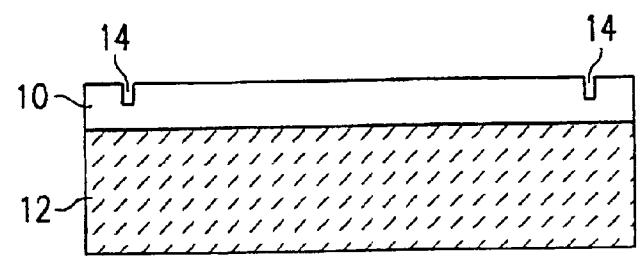
Figure 1E:
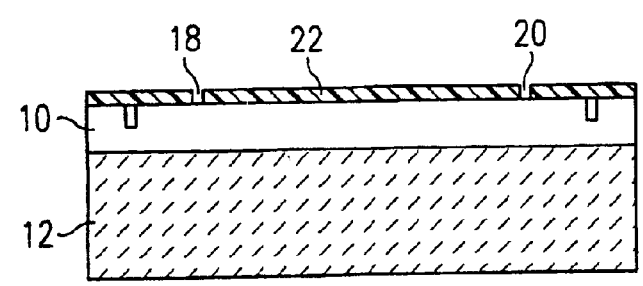

The process flow for manufacturing two-axis analog mirror devices wherein the individual dies, elements or devices are diced or separated by the same through the wafer etch that forms the features of the mirror is illustrated in FIGS. 1A–1H. As shown in FIG. 1A, a 115 $\mu$m thick wafer 10 is bonded to a carrier or backing wafer 12 (see FIG. 1B). Optional alignment marks 14 may then be etched into the thin wafer material or other suitable material using a resist layer 16 along with photolithography and plasma etching as shown in FIG. 1C. After the plasma etch, the resist 16 used to form the optional alignment marks 14 is then stripped as shown in FIG. 1D. The features of the micromirror or MEMS devices and the device boundaries or lines separating individual devices are then patterned with photolithography as indicated by line gaps 18 and 20 respectively patterned in a second resist layer 22 as is well known by those skilled in the art. This arrangement is shown in FIG. 1E. It will also be appreciated that wafer 10 may also undergo various other semiconductor processing steps before a second etching step discussed below. For example, electronic components, sensors or additional mechanical features can be created on wafer 10 by various IC or MEMS fabrication processes.

Figure 1F:
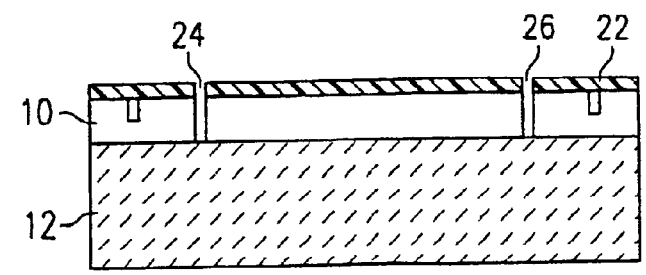
Figure 1G:
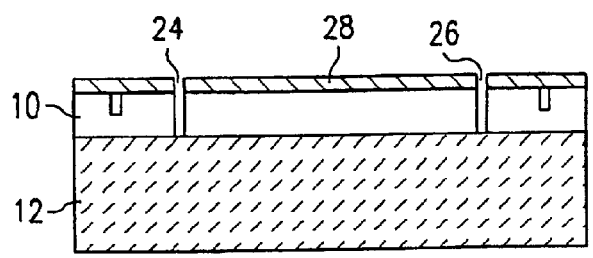
Figure 1H:
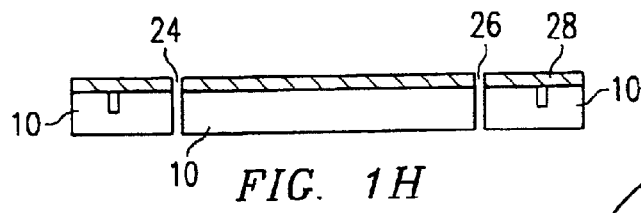

As shown in FIG. 1F, and as mentioned above, the mirror features and the boundaries between devices formed by gap or line patterns 18 and 20 respectively are then etched completely through the wafer 10 as indicated by reference numbers 24 and 26. Although other etching methods may be acceptable, a particularly effective etching process is the use of a special ICP reactor along with the Bosch process described in U.S. Pat. No. 5,498,312. It is important to note at this point that according to the method of manufacturing of this invention, at the same time the mirror features as indicated at etch line 24 are etched completely through the wafer 10, the line patterns or etches such as indicated at etch 26 used to separate the individual dies or mirrors are also etched completely through the wafer 10. After the etching process, the second photo resist layer 22 is stripped away, and as shown in FIG. 1G, the multiplicity of devices formed in wafer 10, and still bonded to the carrier or backing wafer 12 are given a reflective coat 28, such as gold for example. Finally, the mirror die or individual mirrors are released from the carrier wafer 12 as shown in FIG. 1H. This is accomplished by placing the combination carrier or backing wafer 12 and the devices formed in wafer 10 in a solvent bath to dissolve the agent that was used to bond the carrier wafer 12 and wafer 10 together. The bonding agent is typically a photo resist. Therefore, according to one embodiment, the solvent for separating the backing wafer 12 from the wafer 10 is acetone.

Figure 2A:
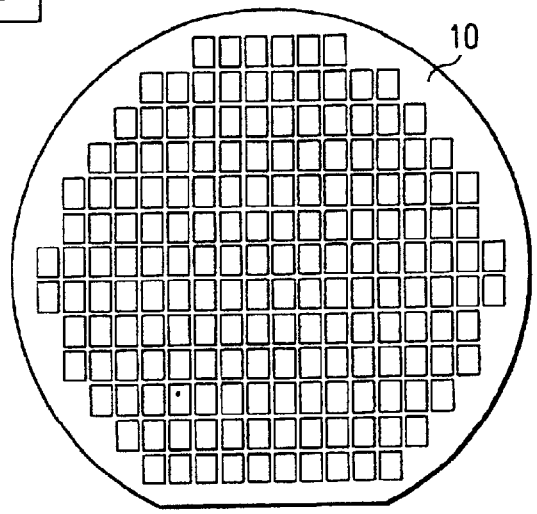
FIG. 2A illustrates a wafer such as silicon having a multiplicity of mirrors.
Figure 2B:
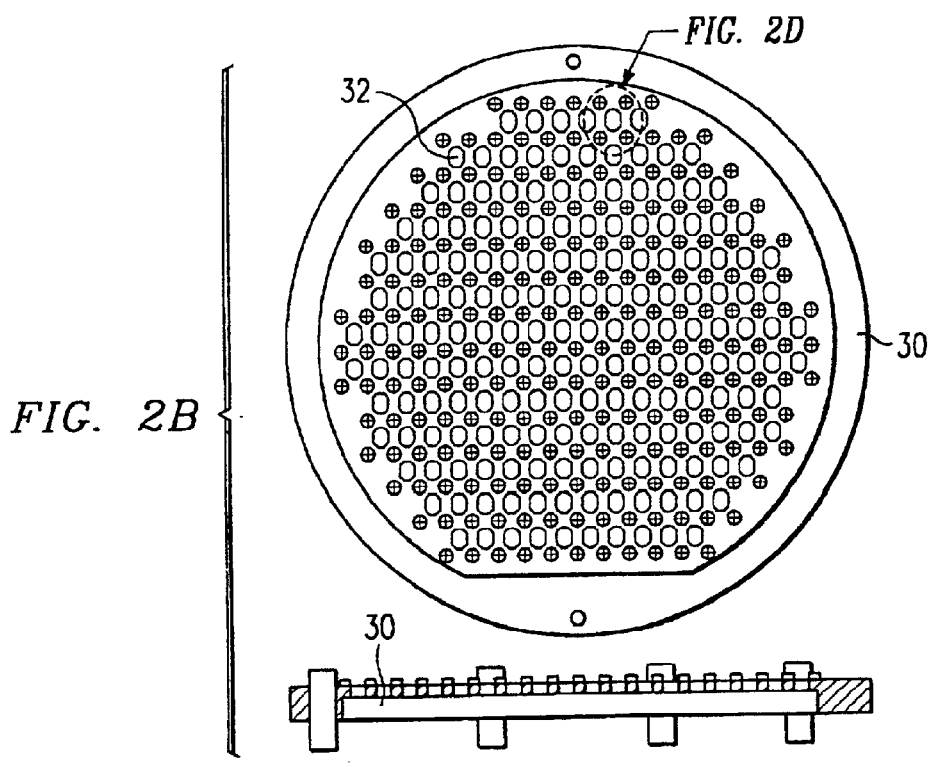
FIG. 2B shows a top view and a side view of a fixture for catching the individual mirror devices upon release.
Figure 2C:
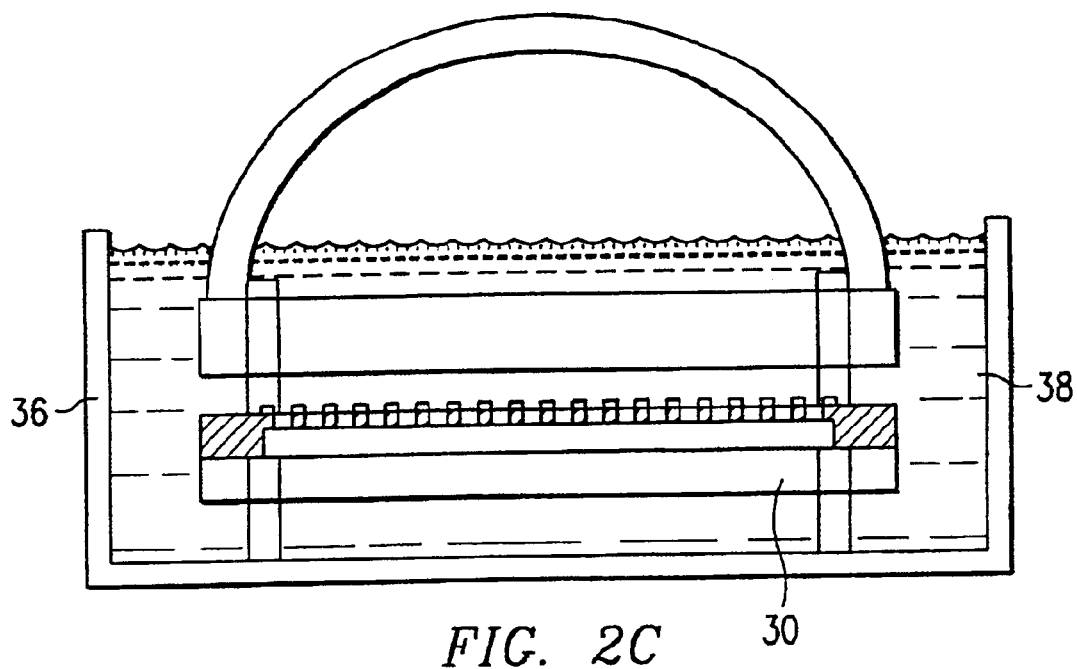
FIG. 2C is a cross-section of the apparatus used to release the silicon devices from the backing wafer used by the manufacturing process of this invention.
Figure 2D:
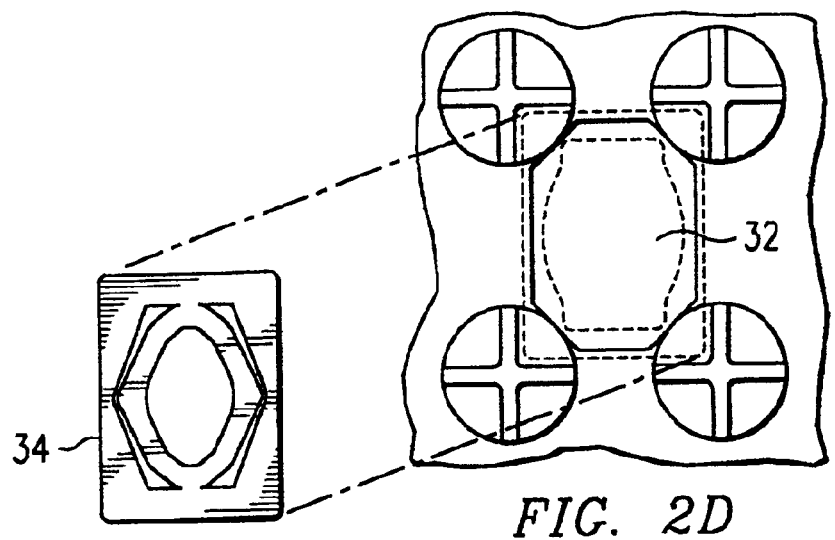
FIG. 2D is an enlarged view of a pocket on the fixture of FIG. 2B and also shows an individual mirror device caught by the fixture of FIG. 2B.

Referring now to FIGS. 2A, 2B, 2C and 2D, there is shown the wafer 10 with the individual mirrors etched therein, a fixture for catching the individual dies or mirrors after they are released from the backing or carrier wafer 12 (top and side view shown in FIG. 2B), and a cross-sectional view of the solvent bath with the wafer 10 and fixture of 2B in place as used during the release process (FIG. 2C). As shown in FIG. 2A, the embodiment illustrates 178 individual mirrors or dies etched into the wafer 10. Likewise, fixture 30 shows an equal number or 178 pockets such as pocket 32 more clearly seen in the broken out or blown up illustration of FIG. 2D, which catch the individual mirrors or dies, such as mirror and gimbal structure 34, after they are released. The mirrors formed in wafer 10 are aligned on the fixture 30 of FIG. 2B so that each individual mirror is over a pocket 32 that catches the mirror after release. As shown in FIG. 2C, the mirrors formed in wafer 10 are loaded upside down in the fixture so that gravity will pull the individual mirrors down into an aligned pocket 32 as they are released from the carrier wafer 12.

Once the mirrors formed in wafer 10 are properly located and aligned over fixture 30, the combination wafer structure and fixture 30 are placed in tank 36 having a solvent 38, such as acetone, for a time period sufficient to dissolve the bonding agent. As an example, if the bonding agent is a photo resist and the solvent is acetone, then a soak of about two hours should provide a clean release. The fixture with the released mirrors is then moved to a hot IPA (Isopropyl Alcohol) bath of about 50° C. for about five minutes. The fixture 30 and mirrors are then removed from the IPA bath and air dried.

Since the individual mirrors are very difficult to ship (if shipping is to occur), the individual dies because they are fragile and cannot readily be shipped using the accepted methods for shipping electronic die or chips, such as gel-track trays or chip trays, the bonded combination of devices formed in wafer 10 and backing wafer 12 is shipped as a unit. Thus, it may also be appropriate to transfer the release process to the assembly vendor. This means that yield data on the mirror dies may not be available until final testing of the assembled mirrors.

The present invention relates to individual mirror devices formed on a wafer using processing steps some of which have similarity to steps used in manufacturing IC's and other semiconductor devices. Referring again to the process discussed with respect to FIGS. 1A through 1H, it is noted that the described process follows "mask" guidelines which requires all features on the wafer, or each individual device, to be created by etching trenches having a constant width, such as for example only, 10 μm. This rule or guideline is followed because of "microloading" which occurs with plasma etching. As discussed above, microloading results because lines of different widths etch at different rates, and more specifically, "wide" lines etch at a faster rate than "thin" lines. Thus, to provide consistency in etching of features, a standard rule is that all lines including features and separating lines are to be etched by lines having a constant width (such as for example 10 μm). Consequently, as shown in FIGS. 3A and 3B, if an area 40 (FIG. 3B), that is larger than 10 μm is to be removed, the process of FIGS. 1A through 1H will require etching 10 μm lines 42 around the area to be removed so as to leave a break-away area or portion 44 as shown in FIG. 3A. For example in FIGS. 3A and 3B, the area to be removed is 50 μm. This break-away area or portion 44 is then removed after the release process. The break-away area or portion 44 will typically simply fall away after the individual dies or mirrors are removed from the backing wafer 12. As mentioned above, care should be taken to assure the break-away areas or portions 44 are completely removed and do not stick to one of the mirror devices as this would cause a failure. FIG. 4A illustrates the gimbal support structure 46 and a mirror 48 attached to the gimbal support structure 46 by a torsion hinge 50, as well as a blow up view of an alignment stop 52 (there may be more than one stop) between structure 46 and mirror 48 as formed by this process. This illustration shows how all etch lines may be limited to a minimum of 10 μm, yet some parts of the structure may be divided by a spacing less than 10 μm.

It will also be appreciated by those skilled in the art that although silicon is often preferred for such processes, other suitable materials such as, but not limited to, gallium arsenide, quartz and silicon carbide may also be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A process for manufacturing a plurality of MEMS devices on a layer of material of a selected thickness comprising the steps of:

attaching said layer of material to a backing layer of material;

defining both the features on each individual ones of said plurality of MEMS devices and the boundaries between individual ones of said plurality of MEMS devices with a constant line width;

etching said lines defining device features and said lines defining boundaries until said lines are etched through said selected thickness; and separating said devices formed in said layer of material from said backing layer.

2. The process of claim 1 further comprising cleaning said devices subsequent to said separation step.

3. The process of claim 1 wherein said layer of material is selected from the group consisting of silicon, gallium arsenide, quartz and silicon carbide.

4. The process of claim 3 wherein said layer of material is silicon.

5. The process of claim 1 wherein said layer of material has a thickness of about 115 µm.

6. The process of claim 1 further comprising etching alignment marks in said layer of material prior to said defining step.

7. The process of claim 6 wherein said step of etching alignment marks comprising the steps of depositing a resist layer over said layer of material, patterning said alignment marks on said resist layers with photolithography, etching said patterned alignment marks into said layer of material, and stripping said resist layer from said layer of material.

8. The process of claim 1 wherein said step of defining features and boundaries comprises the steps of depositing a resist layer and patterning said defined features and boundaries on said resist with photolithography.

9. The process of claim 8 wherein said etching step comprises the steps of using an ICP plasma reactor and the Bosch process.

10. The process of claim 8 further comprising stripping away said resist layer subsequent to said etching step.

11. The process of claim 1 further comprising depositing a reflective coating on said etched layer of material prior to said separating step.

12. The process of claim 11 wherein said reflective coating is gold.

13. The process of claim 1 and comprising further processing steps prior to said etching step.

14. The process of claim 13 wherein said further processing step comprises forming a feature selected from the group consisting of electronic components, sensors and mechanical features on said wafer.

15. The process of step 1 wherein said separating step comprises the step of placing said backing layer with said attached first layer of material in a solvent bath.

16. The process of step 15 wherein said solvent bath is acetone.

17. The process of claim 15 further comprising aligning a fixture for catching individual devices subsequent to said etching step and prior to said placing step.

18. The process of claim 1 wherein said constant line width is about 10 µm.

19. The process of claim 1 wherein said step of defining further comprises defining the perimeter of open areas larger than said constant line width by lines having said constant line width so as to leave an unattached portion.

20. The process of claim 19 wherein said unattached portion is removed during said separation step.

21. A process for manufacturing a plurality of gimbal mirror devices on a layer of material of a selected thickness comprising:

attaching said layer of material to a backing layer of material;

defining both the features on each individual ones of said plurality of gimbal mirror devices and the boundaries between individual ones of said plurality of gimbal mirror devices with lines having a constant width;

etching said lines until said lines are etched through said first selected thickness; and separating said plurality of gimbal mirror devices from said backing layer.

22. The process of claim 21 and comprising a further processing step prior to said etching step.

23. The process of claim 22 wherein said further processing step comprises forming a feature selected from the group consisting of electronic components, sensors and mechanical features on said wafer.

24. The process of claim 21 wherein said layer of material has a thickness of about 115 µm.

25. The process of claim 21 further comprising etching alignment marks in said layer of material prior to said defining step.

26. The process of claim 21 further comprising depositing a reflective coating on said etched layer of material prior to said separating step.

27. The process of claim 26 wherein said reflective coating is gold.

28. The process of step 21 wherein said separating step comprises the step of placing said backing layer with said attached first layer of material in a solvent bath.

29. The process of step 28 wherein said solvent bath is acetone.

30. The process of claim 28 further comprising aligning a fixture for catching individual devices subsequent to said etching step and prior to said placing step.

31. The process of claim 21 wherein said constant line width is about 10 µm.

32. The process of claim 21 wherein said step of defining further comprises defining the perimeter of open areas larger than said constant line width by lines having said constant line width so as to leave an unattached portion.

33. The process of claim 32 wherein said unattached portion is removed during said separation step.

* * * * *